(12) United States Patent
Morii

(10) Patent No.: US 11,348,762 B2
(45) Date of Patent: May 31, 2022

(54) HIGH-FREQUENCY POWER SUPPLY SYSTEM

(71) Applicant: DAIHEN Corporation, Osaka (JP)

(72) Inventor: Tatsuya Morii, Osaka (JP)

(73) Assignee: DAIHEN Corporation, Osaka (JP)

( * ) Notice: Subject to any disclaimer, the term of this patent is extended or adjusted under 35 U.S.C. 154(b) by 0 days.

(21) Appl. No.: 17/126,889

(22) Filed: Dec. 18, 2020

(65) Prior Publication Data

US 2021/0202211 A1    Jul. 1, 2021

(30) Foreign Application Priority Data

Dec. 27, 2019 (JP) .............................. JP2019-237714

(51) Int. Cl.
 *H01J 37/32* (2006.01)
(52) U.S. Cl.
 CPC .............................. *H01J 37/32183* (2013.01)
(58) Field of Classification Search
 CPC .............................................. H01J 37/32183
 See application file for complete search history.

(56) References Cited

U.S. PATENT DOCUMENTS

| 7,251,121 B2 | 7/2007 | Bhutta |
| 7,298,128 B2 | 11/2007 | Bhutta |

(Continued)

FOREIGN PATENT DOCUMENTS

| CN | 102709145 B | * 12/2014 | ........ H01J 37/32091 |
| JP | H7-74159 A | 3/1995 | |

(Continued)

*Primary Examiner* — Henry Luong
(74) *Attorney, Agent, or Firm* — Bret E. Field; Bozicevic, Field & Francis LLP

(57) ABSTRACT

Proposed are techniques for suppressing an increase in a reflected wave power Pr (synonymous with a reflection coefficient) due to IMD. A high-frequency power supply system for providing a high-frequency power to a connected load includes: a bias power supply that outputs a bias power at a first frequency; a source power supply that outputs a source power at a second frequency higher than the first frequency; and a matching unit including an impedance matching circuit that acquires the bias power and the source power, and provides matching between an impedance on the source power supply side and an impedance on the load side. The source power supply supplies the bias power supply with a sinusoidal synchronizing signal including information about an output frequency to be outputted by the bias power supply, and the bias power supply outputs the bias power of a frequency corresponding to the output frequency included in the sinusoidal synchronizing signal. The matching unit performs a process for dividing a forward wave power due to the source power supply for one cycle of the bias power and a reflected wave power toward the source power supply, into a plurality of sections, a process for performing, with respect to each of the plurality of sections, a frequency matching calculation to determine a frequency setting value for each section, and a process for transmitting the frequency setting value for each section to the source power supply. The source power supply, in accordance with the frequency setting values for the plurality of sections transmitted from the matching unit, outputs the bias power in the plurality of section.

5 Claims, 5 Drawing Sheets

(56) References Cited

U.S. PATENT DOCUMENTS

| | | |
|---|---|---|
| 9,196,459 B2 | 11/2015 | Bhutta |
| 9,306,533 B1 | 4/2016 | Mavretic |
| 9,345,122 B2 | 5/2016 | Bhutta |
| 9,496,122 B1 | 11/2016 | Bhutta |
| 9,525,412 B2 | 12/2016 | Mavretic |
| 9,543,122 B2 | 1/2017 | Bhutta |
| 9,584,090 B2 | 2/2017 | Mavretic |
| 9,591,739 B2 | 3/2017 | Bhutta |
| 9,697,991 B2 | 7/2017 | Bhutta |
| 9,728,378 B2 | 8/2017 | Bhutta et al. |
| 9,729,122 B2 | 8/2017 | Mavretic |
| 9,745,660 B2 | 8/2017 | Bhutta |
| 9,755,641 B1 | 9/2017 | Bhutta |
| 9,844,127 B2 | 12/2017 | Bhutta |
| 9,865,432 B1 | 1/2018 | Bhutta |
| 10,026,594 B2 | 7/2018 | Bhutta |
| 10,217,608 B2 | 2/2019 | Mavretic |
| 10,340,879 B2 | 7/2019 | Mavretic et al. |
| 10,431,424 B2 | 10/2019 | Mavretic et al. |
| 10,431,428 B2 | 10/2019 | Bhutta et al. |
| 10,454,453 B2 | 10/2019 | Bhutta et al. |
| 10,455,729 B2 | 10/2019 | Bhutta |
| 10,460,912 B2 | 10/2019 | Bhutta et al. |
| 10,483,090 B2 | 11/2019 | Bhutta et al. |
| 10,707,057 B2 | 7/2020 | Bhutta et al. |
| 10,727,029 B2 | 7/2020 | Ulrich et al. |
| 2002/0047009 A1 * | 4/2002 | Flugstad ............... H05B 6/50 219/771 |
| 2007/0170997 A1 | 7/2007 | Matsuno |
| 2008/0129407 A1 | 6/2008 | Matsuno |
| 2009/0255800 A1 * | 10/2009 | Koshimizu ....... H01J 37/32091 422/186.29 |
| 2014/0091875 A1 | 4/2014 | Shimomoto et al. |
| 2015/0244342 A1 | 8/2015 | Shimomoto et al. |
| 2016/0065207 A1 | 3/2016 | Bhutta |
| 2016/0380610 A1 | 12/2016 | Ulrich |
| 2017/0178865 A1 | 6/2017 | Ulrich |
| 2018/0076788 A1 | 3/2018 | Decker et al. |
| 2019/0172683 A1 | 6/2019 | Mavretic et al. |
| 2019/0267212 A1 | 8/2019 | Mavretic |
| 2019/0272978 A1 | 9/2019 | Ahmed et al. |
| 2019/0326094 A1 | 10/2019 | Bhutta |
| 2020/0035461 A1 | 1/2020 | Bhutta et al. |
| 2020/0051788 A1 | 2/2020 | Ulrich |
| 2020/0066488 A1 | 2/2020 | Ulrich et al. |
| 2020/0066489 A1 | 2/2020 | Lozic et al. |
| 2020/0083022 A1 | 3/2020 | Huang et al. |
| 2020/0126765 A1 | 4/2020 | Ulrich et al. |

FOREIGN PATENT DOCUMENTS

| | | | |
|---|---|---|---|
| JP | 2006-166412 A | 6/2006 | |
| JP | 2008300873 A * | 12/2008 | ........ H01J 37/32091 |
| JP | 2014-72806 A | 4/2014 | |

* cited by examiner

FIG. 2

| | C1 | | | | | |
|---|---|---|---|---|---|---|
| | | 0 | 20 | 40 | 60 | 80 | 100 |
| C2 | 0 | $A_{00}$ | $A_{01}$ | $A_{02}$ | $A_{03}$ | $A_{04}$ | $A_{05}$ |
| | 20 | $A_{10}$ | $A_{11}$ | $A_{12}$ | $A_{13}$ | $A_{14}$ | $A_{15}$ |
| | 40 | $A_{20}$ | $A_{21}$ | $A_{22}$ | $A_{23}$ | $A_{24}$ | $A_{25}$ |
| | 60 | $A_{30}$ | $A_{31}$ | $A_{32}$ | $A_{33}$ | $A_{34}$ | $A_{35}$ |
| | 80 | $A_{40}$ | $A_{41}$ | $A_{42}$ | $A_{43}$ | $A_{44}$ | $A_{45}$ |
| | 100 | $A_{50}$ | $A_{51}$ | $A_{52}$ | $A_{53}$ | $A_{54}$ | $A_{55}$ |

Table 1: Position-characteristics parameter table

| | Freq | | | | | | |
|---|---|---|---|---|---|---|---|
| | -0.9 | -0.6 | -0.3 | 0 | 0.3 | 0.6 | 0.9 |
| $A_{mn}$ | $A_{mn0}$ | $A_{mn1}$ | $A_{mn2}$ | $A_{mn3}$ | $A_{mn4}$ | $A_{mn5}$ | $A_{mn6}$ |

Table 2: Frequency-characteristics parameter table

HIGH-FREQUENCY POWER SUPPLY SYSTEM

CROSS REFERENCE TO RELATED APPLICATIONS

The present application claims priority from Japanese patent application JP2019-237714 filed on Dec. 27, 2019, the content of which is hereby incorporated by reference into this application.

BACKGROUND

Technical Field

The present disclosure relates to a high-frequency power supply system.

In the field of semiconductor manufacturing, as electronic equipment has become smaller and functionally more enhanced, there is a need for higher-density mounting, smaller connections of elements to a mounting substrate, and higher mounting reliability.

One of the ways in which mounting reliability can be ensured is by surface modification using plasma. For example, when a substrate to be processed is subjected to plasma processing, it is possible to remove contamination due to organic matter attached to the surface of the substrate, to increase the bonding strength of wire bonding, to improve wettability, and to improve adhesion between the substrate and sealing resin. In order to perform such plasma processing, it is necessary to connect a power supply device to a plasma reactor apparatus.

For example, JP H07-74159 A discloses a configuration example of a power supply device connected to a plasma reactor apparatus. Specifically, JP H07-74159 A discloses a configuration in which a high-frequency (source) power supply and a low-frequency (bias) power supply are superimposed with each other via a matching circuit to supply power to the plasma reactor apparatus. In the matching circuit, impedance matching is achieved between the power supply side and the plasma reactance device side to provide an efficient power supply.

SUMMARY

When a dual-frequency power supply is provided, as discussed in JP H07-74159 A, it is known that a plasma sheath is generated in the plasma chamber of the plasma reactor apparatus, together with a plasma. Generally, the plasma sheath may be considered to be electrically insulated, and it may be considered that a virtual capacitor is formed between the electrodes of the plasma chamber. Because the location of the plasma varies in conjunction with periodic changes in the voltage of the low frequency (bias) power supply, the capacitance of the plasma sheath also varies periodically (for example, with a period corresponding to, or twice, the bias frequency, depending on the structure of the plasma chamber). That is, the plasma impedance varies rapidly due to changes in the voltage of the bias power supply.

However, when an impedance variable element is operated by means of a motor in a matching unit, the matching operation cannot follow rapid changes in plasma impedance. As a result, the amount of reflected wave power Pr that returns to the output end of the source power supply increases due to inter-modulation distortion (IMD). Because an increase in reflected waves prevents efficient and accurate supply of power to the load side, it is necessary to reduce IMD.

In view of above circumstances, the present disclosure proposes techniques for suppressing an increase in reflected wave power Pr (which is synonymous with a reflection coefficient) due to IMD.

The present disclosure provides a high-frequency power supply system for providing a high-frequency power to a connected load, the high-frequency power supply system including: a bias power supply that outputs a bias power at a first frequency; a source power supply that outputs a source power at a second frequency higher than the first frequency; and a matching unit including an impedance matching circuit that acquires the bias power and the source power and provides matching between an impedance on the source power supply side and an impedance on the load side. The source power supply supplies the bias power supply with a sinusoidal synchronizing signal including information about an output frequency to be outputted by the bias power supply. The bias power supply outputs the bias power of a frequency corresponding to the output frequency included in the sinusoidal synchronizing signal. The matching unit performs a process for dividing a forward wave power due to the source power supply for one cycle of the bias power and a reflected wave power toward the source power supply, into a plurality of sections, a process for performing, with respect to each of the plurality of sections, a frequency matching calculation to determine a frequency setting value for each section, and a process for transmitting the frequency setting value for each section to the source power supply. The source power supply, in accordance with the frequency setting values for the plurality of sections transmitted from the matching unit, outputs the bias power in the plurality of sections.

Additional features of the present disclosure will become apparent from the detailed descriptions herein and the accompanying drawings. Aspects of the present disclosure are achieved and provided by elements and various combinations of elements, as well as by the following detailed description and the appended claims.

It should be understood that the descriptions herein are merely illustrative and do not limit the scope of the claims or implementation examples in any way.

According to the techniques of the present disclosure, it is possible to reduce IMD generated on the load side in a power supply device providing a dual-frequency power supply, and to suppress an increase in reflected power (reflection coefficient) due to IMD.

BRIEF DESCRIPTION OF THE DRAWINGS

FIG. 2 illustrates a configuration example of a 3-dimensional S-parameter table providing S-parameters corresponding to the position and frequency (amount of frequency shift) of variable capacitors. Table 1 shows a position-characteristics parameter table, and Table 2 shows a frequency (amount of shift from a fundamental frequency)-characteristics parameter;

DETAILED DESCRIPTION

In the following, an embodiment of the present disclosure will be described with reference to the attached drawings. In the attached drawings, functionally similar elements may be shown at similar numerals. While the attached drawings illustrate a concrete embodiment and an implementation example in accordance with the principles of the present disclosure, these are set forth to facilitate an understanding of the present disclosure, and are by no means to be construed as limiting the present disclosure.

It should be understood that, while the present embodiment is described in sufficient detail to enable those person skilled in the art to practice the present disclosure, other implementations and embodiments may be utilized, and that various changes in configuration or structure and substitution of elements may be made without departing from the spirit and scope of the technical concepts of the present disclosure. Accordingly, the following description should not be construed as limiting.

Further, an embodiment of the present disclosure may be implemented using software operating on a general-purpose computer, or may be implemented using dedicated hardware or a combination of software and hardware.

Configuration Example of Power Supply System 1

(i) Configuration Example 1

Figure 1:
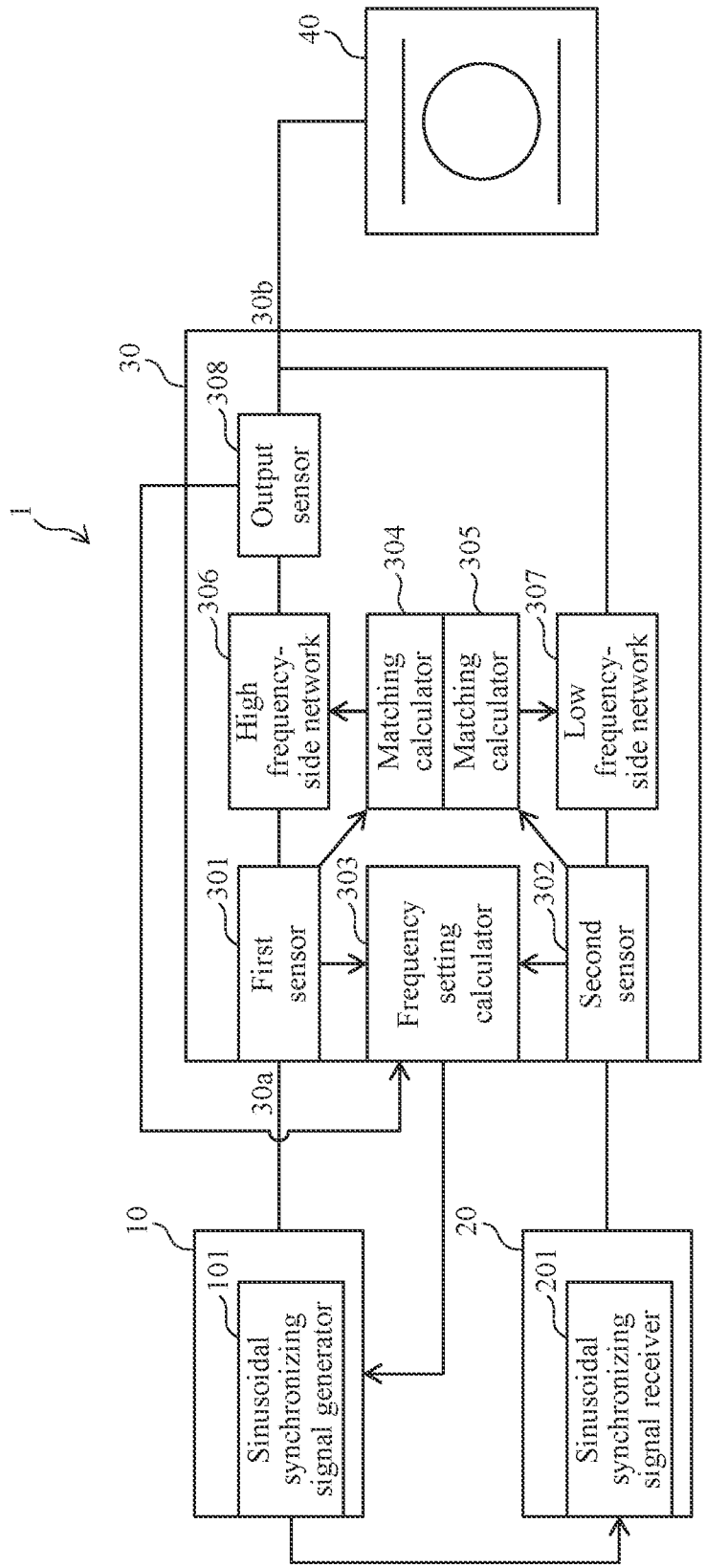
FIG. 1 illustrates a state in which a plasma load 40 is connected to a power supply system (also referred to as a high-frequency power supply system) 1 according to an embodiment.

FIG. 1 illustrates a state in which a plasma load 40 is connected to a power supply system (also referred to as a high-frequency power supply system) 1 of the present embodiment. The power supply system 1 includes a source power supply (which supplies a high frequency output) 10; a bias power supply (which supplies a low-frequency output) 20; and a matching unit (also referred to as an impedance converter) 30 to which outputs from both the source power supply 10 and the bias power supply 20 are supplied, and which matches impedance between the side of the source power supply 10 and the bias power supply 20 and the side of the plasma load 40. In the system, a forward wave power (source power) outputted from the source power supply 10 and a forward wave power (bias power) outputted from the bias power supply 20 are superimposed with each other, for example, and then supplied to the plasma load 40.

FIG. 1 only shows a sinusoidal synchronizing signal generator 101 as an internal configuration of the source power supply 10. However, a general internal configuration may include, for example, an RF amplifier, a sensor (directional coupler), a control device and the like. The RF amplifier, for example, in response to a control signal from the control device, amplifies a high-frequency signal of a predetermined frequency (for example, 13.56 MHz, 27.12 MHz, 40.68 MHz, 60 MHz, 100 MHz, or 120 MHz), and supplies an amplified signal to the sensor. The sensor, for example, detects a high frequency output (forward wave power Pf) from the RF amplifier, and detects a reflected wave power Pr from the matching unit 30 and a phase difference between a voltage component of the forward wave power Pf and a voltage component of the reflected wave power Pr. The sensor may be configured to output the forward wave power Pf to the matching unit 30, and also to output the detected forward wave power Pf value, the reflected wave power Pr, and a phase signal to the control device. The sinusoidal synchronizing signal generator 101 in the source power supply 10 outputs to the bias power supply 20 information about a frequency and phase (for example, a sine wave of 400 kHz) at which the bias power supply 20 is to operate in synchronism.

FIG. 1 also only shows a sinusoidal synchronizing signal receiver 201 as an internal configuration of the bias power supply 20. However, as in the case of the source power supply 10, a general internal configuration may include an RF amplifier, a sensor (directional coupler), a control device and the like. The sinusoidal synchronizing signal receiver 201 in the bias power supply 20 extracts information about a frequency and phase included in the sinusoidal synchronizing signal supplied from the source power supply 10. Then, an oscillator of the bias power supply 20 outputs the forward wave power (RF output) in synchronism with the extracted frequency and phase, and supplies the synchronized forward wave power to the matching unit 30.

The matching unit 30 includes a first sensor 301, a second sensor 302, a frequency setting calculator 303, a first matching calculator 304, a second matching calculator 305, a first matching network 306, a second matching network 307, and an output sensor 308. The first sensor 301 detects the forward wave power Pf supplied from the source power supply 10 on the high frequency side and the reflected wave power Pr returning from the plasma load 40, and provides the powers Pf and Pr to the frequency setting calculator 303.

The second sensor 302 detects the forward wave power Pf supplied from the bias power supply 20 on the low frequency side and the reflected wave power Pr returning from the plasma load 40, and provides the forward wave power Pf and the reflected wave power Pr (including information about the phase of the forward wave power Pf) to the frequency setting calculator 303.

The frequency setting calculator 303, in synchronism with the phase of the forward wave power Pf on the low frequency (bias power supply 20) side, divides the output of the source power supply 10 for one cycle of the operating frequency (for example, 400 kHz) of the bias power supply 20 into a plurality of sections (divide-by number n), and, with respect to each section, computes an impedance on the high frequency side using the forward wave power Pf and the reflected wave power Pr on the high frequency (source power supply 10) side. Also, the frequency setting calculator 303, on the basis of the impedance on the high frequency side in each section, calculates a frequency setting value in each section. Then, the frequency setting calculator 303 supplies a set of frequency setting values for the respective sections (1 to n) to the source power supply 10 on the high frequency side.

The first matching calculator 304, the second matching calculator 305, the high frequency-side matching network 306, the low frequency-side matching network 307, and the output sensor 308 included in the matching unit 30 are provided in a conventional matching unit. For example, the high frequency-side matching network 306 and the low frequency-side matching network 307 are configured of variable capacitors and variable inductors. The first matching calculator 304 and the second matching calculator 305 are configured of a motor for changing the capacitance of the variable capacitor or the inductance of the variable inductor included in the matching networks, a controller (processor)

and the like. Further, the output sensor 308 detects the forward wave power Pf and reflected wave power Pr on the load side.

The operation of the power supply system 1 will be described in greater detail.

S-Parameter and T-Parameter

The matching unit 30 holds, in a memory not shown, a 3-dimensional S-parameter table for providing S-parameters corresponding to the position and frequency (amount of shift from a fundamental frequency) of variable capacitors. The S-parameters may not be necessarily held in table format, and may have any form as long as variable capacitor values and frequency shifts are associated with S-parameters on a one-to-one basis.

FIG. 2 illustrates a configuration example of the 3-dimensional S-parameter table providing S-parameters corresponding to the position and frequency (amount of frequency shift) of variable capacitors. Table 1 is a position-characteristics parameter table. Table 2 shows frequency (amount of shift from a fundamental frequency)-characteristics parameters. The granularity of each table is merely an example, and the tables may be configured in finer steps. An S-parameter may be subjected to an interpolating calculation so that an optimum S-parameter can be used. The S-parameters (scattering parameters) herein indicate, as well known, transmission characteristics in a specific four-terminal network (also called a two-terminal network) when, for example, in a relationship with the position of a variable capacitor, a high-frequency signal connected to lines of a characteristic impedance (such as 50Ω) is inputted to the input terminals and output terminals of the four-terminal network. The S-parameters are expressed by a matrix consisting of the elements of an input-side voltage reflection coefficient, a forward voltage transfer coefficient, an reverse voltage transfer coefficient, and an output-side voltage reflection coefficient. Herein, the matching unit 30 is being handled as a four-terminal network, and the S-parameters in the matching unit 30 are calculated.

As shown in Table 1, it is possible to acquire S-parameters at the current point in time from the combination of the current values of the variable capacitors C1 and C2. Then, with C1 and C2 fixed, it is possible to determine S-parameters ($A_{mn0}$ to $A_{mn6}$) corresponding to the amount of shift in frequency (the amount of shift between the frequency determined from the forward wave power Pf and the reflected wave power Pr in a section k (k=an integer of 1 to n) and the fundamental frequency (for example, 40 MHz)) at the S-parameter $A_{mn}$. For example, if (C1, C2)=(40, 60), the S-parameter is $A_{32}$. In this case, if the actually calculated amount of shift between the frequency of the forward wave power Pf and the fundamental frequency 40 MHz is 0.6 (Hz), the corresponding S-parameter $A_{325}$ is acquired from Table 2. The S-parameter corresponding to the amount of frequency shift, as in the case of the S-parameter due to the relationship with the position of the variable capacitor mentioned above, is also expressed by a matrix consisting of the elements of an input-side voltage reflection coefficient, a forward voltage transfer coefficient, a reverse voltage transfer coefficient, and an output-side voltage reflection coefficient.

For example, in the S-parameters of the four-terminal network, when the input-side voltage reflection coefficient is $S_{11}$, the forward voltage transfer coefficient is $S_{21}$, the reverse voltage transfer coefficient is $S_{12}$, and the output-side voltage reflection coefficient is $S_{22}$, T-parameters (transmission parameters) can be obtained by converting the S-parameters as according to Expression (1). Generally, in a four-terminal network, for example, it is considered convenient to use S-parameters when measuring its transmission characteristic, and to use T-parameters when performing calculations.

$$\frac{1}{S_{12}}\begin{bmatrix} S_{12} \cdot S_{21} - S_{11} \cdot S_{22} & S_{22} \\ -S_{11} & 1 \end{bmatrix} \rightarrow \begin{bmatrix} T_{11} & T_{12} \\ T_{21} & T_{22} \end{bmatrix} \quad (1)$$

Details of Frequency Matching Calculation Process in Power Supply System 1

Figure 3A:
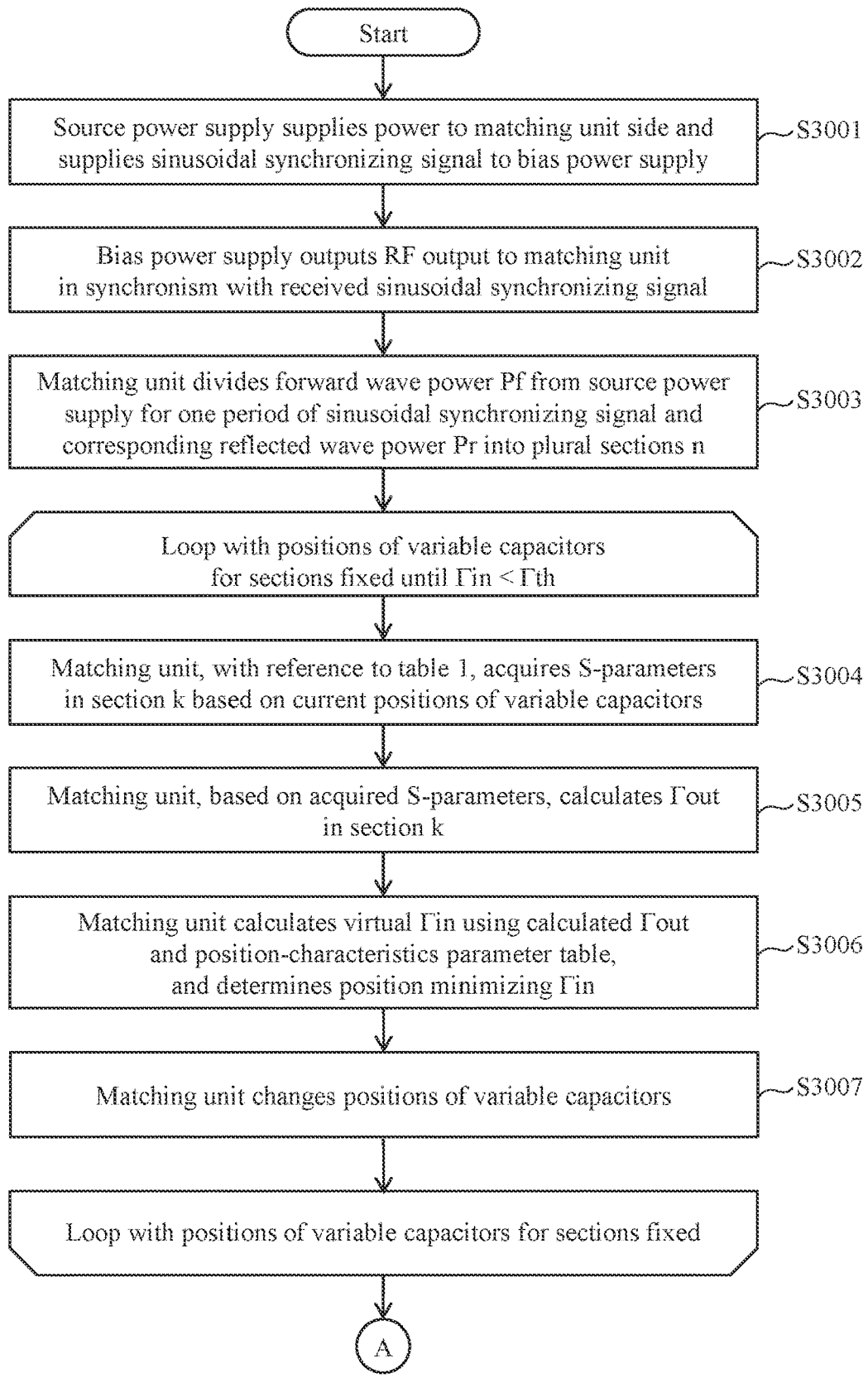
FIG. 3A is a flowchart (first half) for describing in detail a frequency matching calculation process by the power supply system 1 according to the embodiment.
Figure 3B:
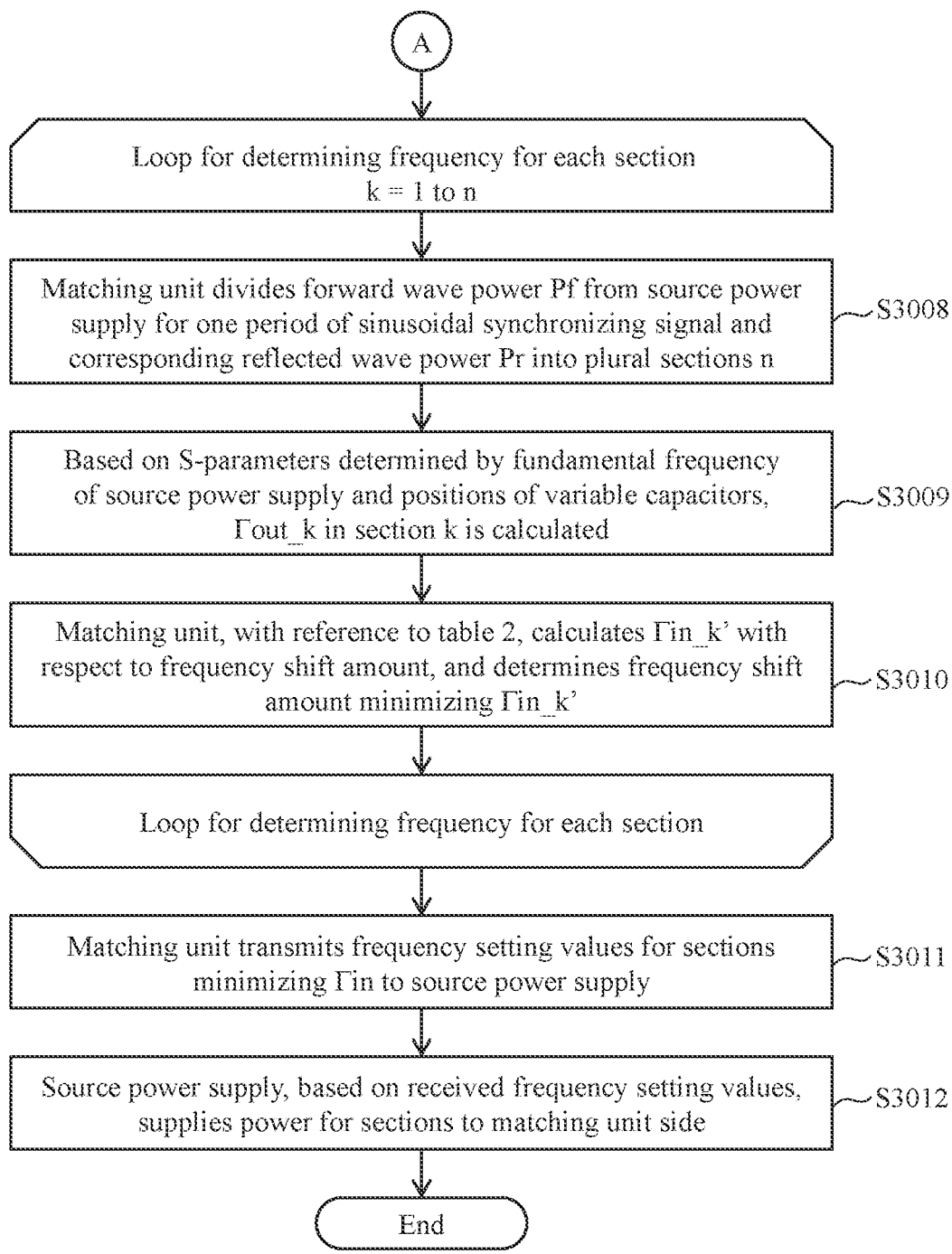
FIG. 3B is a flowchart (latter half) for describing in detail the frequency matching calculation process by the power supply system 1 according to the embodiment.

FIGS. 3A and 3B show a flowchart for describing in detail a frequency matching calculation process performed by the power supply system 1 according to the present embodiment. The frequency matching calculation process may be controlled to be started when the reflection coefficient in the source power supply (high frequency side) 10 has become greater than or equal to a predetermined value, for example. The details of calculations of the S-parameters, T-parameters, Γout, Γin and the like (fundamental technical concepts) as described below are discussed in detail in JP 2006-166412 A and JP 2014-72806 A, for example.

(i) Step 3001

As the power supply system 1 is started, the source power supply 10 starts to supply power to the matching unit 30 side. The sinusoidal synchronizing signal generator 101 of the source power supply 10 supplies a sinusoidal synchronizing signal to the bias power supply 20. The sinusoidal synchronizing signal (synchronizing high-frequency signal) is a sinusoidal signal having an output frequency that the bias power supply 20 should output.

(ii) Step 3002

The sinusoidal synchronizing signal receiver 201 of the bias power supply 20 receives the sinusoidal synchronizing signal from the source power supply 10, and acquires information about the frequency (for example: 400 kHz) and phase of the sinusoidal synchronizing signal. Based on the information about the frequency and phase of the sinusoidal synchronizing signal, an oscillator, not shown, supplies an RF output (forward wave power) to the matching unit 30 side in synchronism with the sinusoidal synchronizing signal. At this time, the output frequency of the source power supply 10 is fixed to a specified frequency (for example, 40.68 MHz).

The first sensor 301 of the matching unit 30 detects the forward wave power Pf supplied from the source power supply 10 and the reflected wave power Pr from the plasma load 40 at the input end of the matching unit 30, or an input voltage Vpf and an input current Ipf. The second sensor 302 of the matching unit 30 detects the forward wave power Pf (including phase information) supplied from the bias power supply 20 and the reflected wave power Pr from the plasma load 40 at the input end of the matching unit 30, or the input voltage Vpf and the input current Ipf.

(iii) Step 3003

The matching calculator 304 of the matching unit 30 obtains the Pf, Pr (or Vpf, Ipf) signals detected by the first sensor 301, and extracts only the output frequency component of the bias power supply, using a bandpass filter. The extracted data is used to determine an input reflection coefficient Γin.

(iv) Step 3004

The matching calculator 304 of the matching unit 30 reads the position-characteristics parameters (Table 1) from the memory not shown, and, with reference to the position-characteristics parameters, acquires S-parameters corresponding to the acquired capacitance values C1 and C2 of the variable capacitors of the high frequency-side matching network 306.

(v) Step 3005

The matching calculator 304, using the S-parameters acquired in step 3004 and the input reflection coefficient Γin, calculates an output reflection coefficient Γout (reflection coefficient at the output end 30b of the matching unit 30). More specifically, T-parameters are calculated from the S-parameters according to Expression 1 (the T-parameter may be calculated in advance and held in memory as a table). Then, a forward wave voltage Vfo and a reflected wave voltage Vro on the load 40 side are calculated from a forward wave voltage Vfi and a reflected wave voltage Vri at the high frequency-side input end 30a of the matching unit 30 and the T-parameters (see Expression (2)).

$$\begin{pmatrix} V_{fo} \\ V_{ro} \end{pmatrix} = \begin{bmatrix} T_{11} & T_{12} \\ T_{21} & T_{22} \end{bmatrix} \begin{pmatrix} V_{fi} \\ V_{ri} \end{pmatrix} \quad (2)$$

The reflection coefficient Γout at the output end 30b is obtained by calculating Vro/Vfo. The forward wave voltage Vfi and the reflected wave voltage Vri at the input end 30a of the matching unit 30 are derived from Expression (2) as according to Expression (3).

$$\begin{pmatrix} V_{fi} \\ V_{ri} \end{pmatrix} = \begin{bmatrix} T_{11} & T_{12} \\ T_{21} & T_{22} \end{bmatrix}^{-1} \begin{pmatrix} V_{fo} \\ V_{ro} \end{pmatrix} \quad (3)$$

The reflection coefficient Γin at the input end 30a (the reflection coefficient Γin at the input end 30a of the matching unit 30) is obtained by computing Vri/Vfi.

(vi) Step 3006

The matching calculator 304 fixes the capacitance values of the variable capacitors to the current positions and determines a virtual input reflection coefficient Γin' using the output reflection coefficient Γout and the position-characteristics parameter table (for example, position-T-parameters). The matching calculator 304 then determines values of the variable capacitors (positions C1 and C2) that minimize the input reflection coefficient Γin'. That is, the matching calculator 304, for example, calculates (Expression (1)) T-parameters corresponding to the S-parameters $A_{00}$ to $A_{55}$ in Table 1, and then determines the reflection coefficient Γin by applying each T-parameter to Expression (3). Then, the matching calculator 304 determines the positions of the variable capacitors (C1min, C2min) that contribute to a minimum reflection coefficient Γin_min from a plurality of reflection coefficients Γin corresponding to the positions of the variable capacitors (C1, C2).

(vii) Step 3007

The matching calculator 304 causes the variable capacitors to be moved to the positions of the variable capacitors (C1min, C2 min) determined in step 3006. After the movement, the matching calculator 304 performs the process of step 3003 and, if the input reflection coefficient Γin is greater than or equal to a threshold value Γth indicating completion of matching, repeats steps 3004 to 3006. If the input reflection coefficient Γin is less than the threshold value Γth, the matching calculator 304 fixes the positions of the variable capacitors and implements step 3008.

(viii) Step 3008

Figure 4:
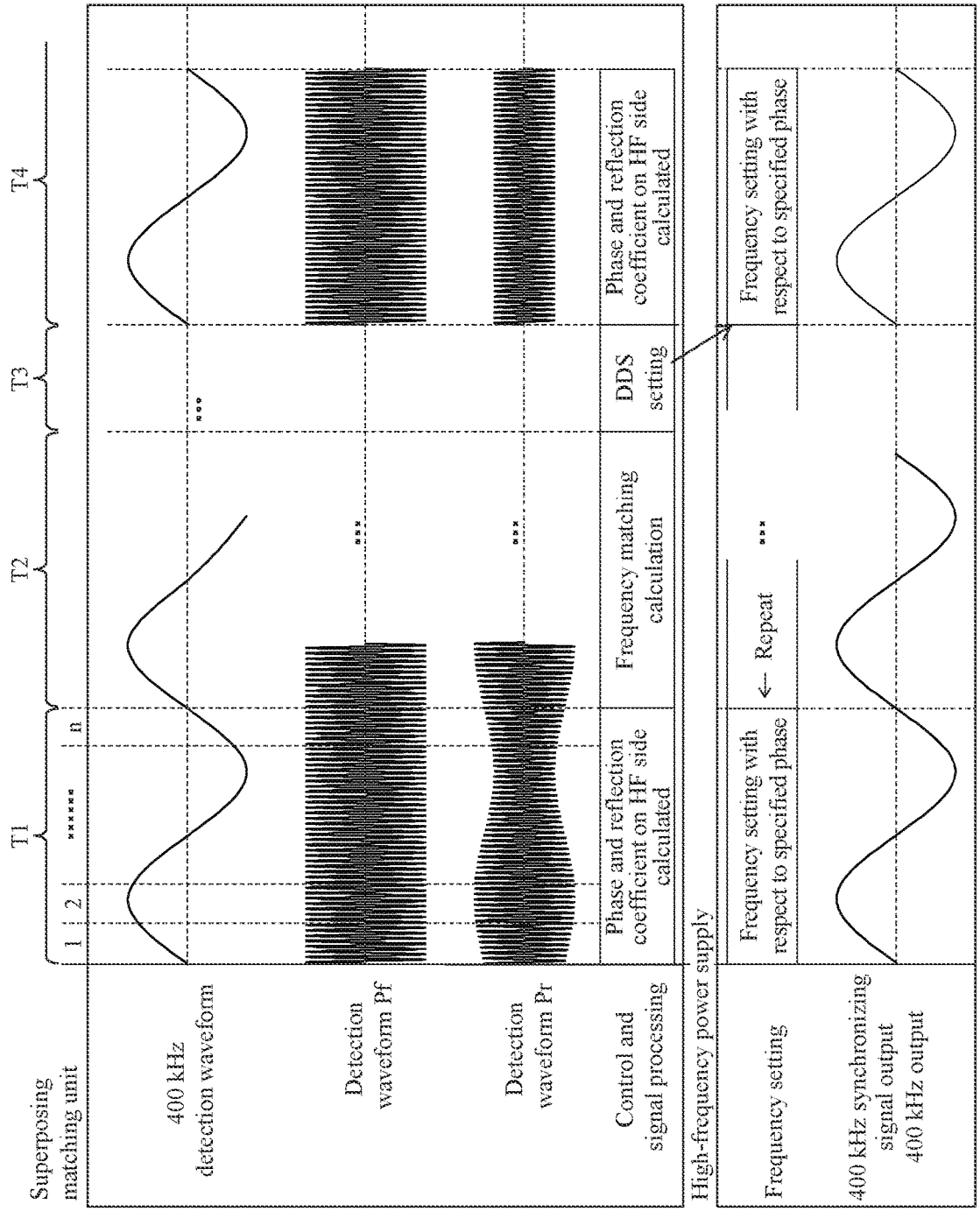
FIG. 4 is a timing chart of a process (frequency setting calculation process) for determining a frequency setting value that is frequency-matched as described with reference to FIGS. 3A and 3B according to the embodiment.

The frequency setting calculator 303 of the matching unit 30 (hereafter simply referred to as the frequency setting calculator 303) divides the forward wave power Pf supplied from the source power supply 10 and the corresponding reflected wave power Pr for a period of the sinusoidal synchronizing signal, into a plurality of sections (divide-by n, n being an integer, for example, divided by 10). FIG. 4 illustrates a state in which the forward wave power Pf supplied from the source power supply 10 and the corresponding reflected wave power Pr for a single period are divided into a plurality of sections (sections 1 to n).

With respect to each of the sections (k=1 to n) obtained by the dividing, the processing from step 3008 to step 3010 is repeated.

(ix) Step 3009

The frequency setting calculator 303, on the basis of the S-parameters determined by the fundamental frequency of the source power supply 10 (for example, 40 MHz) and the positions of the variable capacitors (C1min, C2 min), calculates a Γout_k (a reflection coefficient at the output end 30b of the matching unit 30) in the section k. More specifically, as in the process of step 3005, T-parameters are calculated from the S-parameters using Expression 1 (T-parameters may be calculated in advance and held in the form of a table in memory). Further, the forward wave voltage Vfo and the reflected wave voltage Vro on the load 40 side are calculated (see Expression (2)) from the forward wave voltage Vfi and the reflected wave voltage Vri at the high frequency-side input end 30a of the matching unit 30 and the T-parameter. The reflection coefficient Γout_k at the output end 30b is obtained by calculating Vro/Vfo.

(x) Step 3010

The frequency setting calculator 303, with reference to the frequency-characteristics parameter (Table 2), acquires S-parameters corresponding to the respective amounts of frequency shift (for example: S-parameters corresponding to the amounts of frequency shift −0.9 to 0.9), and calculates T-parameters from the S-parameters according to Expression 1. Then, the frequency setting calculator 303, on the basis of the calculated T-parameters corresponding to the amounts of frequency shift and the output reflection coefficient Γout_k, determines virtual input reflection coefficients Γin_k' at the input end 30a of the matching unit 30, and determines an amount of frequency shift (section k) corresponding to the T-parameter that minimizes Γin_k'. If the granularity of the frequency-characteristics parameter table is too coarse, appropriate S-parameters may be determined by performing an interpolating calculation as discussed in JP 2014-72806 A, and corresponding T-parameters may be adopted, as in the case of the position-characteristics parameter table.

(xi) Step 3011

The frequency setting calculator 303 determines, from the amounts of frequency shift determined with respect to the divided sections 1 to k, frequency setting values (for example, 40 MHz+amounts of frequency shift) for one cycle of the operating cycle (400 kHz) of the bias power supply, and transmits the frequency setting values to the source power supply (for example: a 40-MHz power supply) 10 on the high frequency side. The transmitted frequency setting values are values that are frequency-matched in each section. Accordingly, by supplying power from the source power supply 10 using the frequency setting values, it is possible to suppress the reflection coefficient and to reduce the influence due to IMD.

(xii) Step 3012

The source power supply 10, on the basis of the frequency setting values provided from the matching unit 30, generate power for the respective divided sections (1 to n), and provides the power to the matching unit 30 side. The frequency setting values are used by the source power supply 10 continuously unless they are updated by the matching unit 30 and transmitted to the source power supply 10. Whether the frequency setting values are updated or not can be determined, for example, by the frequency setting calculator 303 of the matching unit 30 monitoring whether the reflection coefficient obtained from the forward wave power Pf and the reflected wave power Pr on the high frequency side (source power supply 10) is greater than or equal to a predetermined value.

(xiii) Others

The frequency setting calculator 303 may sense the frequency of the high-frequency power supply in the section k from the voltage of the forward wave power Pf being supplied from the source power supply 10, and may calculate an amount of shift between the fundamental frequency (for example: 40 MHz) and the sensed frequency of the high-frequency power supply. In this case, if the amount of frequency shift is less than a predetermined threshold value, the process for determining the frequency setting values in the respective divided sections (1 to n) and transmitting the frequency setting values to the source power supply 10 may not be performed.

Timing Chart of Frequency Setting Calculation Process

FIG. 4 is a timing chart of the process (frequency setting calculation process) for determining the frequency-matched frequency setting values according to the present embodiment as illustrated in FIGS. 3A and 3B. In FIG. 4, a delay in the operation of the source power supply 10 on the high frequency side is not taken into consideration.

Referring to FIG. 4, in the period T1 (=the period of one cycle of the operating cycle (400 kHz) of the bias power supply 20: the power supply cycle due to the source power supply 10), the matching unit 30 (frequency setting calculator 303) calculates the phase and the reflection coefficient Γ on the high frequency side (source power supply 10), and also divides the period T1 of one cycle of power supply by n. Then, in the period T2 following the end of the period T1 (which varies depending on the value of the divide-by number n), the matching unit 30 performs a frequency matching calculation (the processing from step 3004 to step 3010 in FIGS. 3A and 3B). For example, when the power supply cycle (for example: 400 kHz) due to the source power supply 10 is divided by n, if the frequency matching calculation takes 1 to 2 μs for each section, the period T2 is n to 2n μs. In the period T3 following the period T2, the frequency setting values for each section obtained by the frequency matching calculation and information about the divided sections are transmitted from the matching unit 30 to the source power supply 10 on the high frequency side (Digital Direct Synthesizer (DDS) setting). Then, in the period T4, the source power supply 10, using the frequency setting values received from the matching unit 30, starts supplying power in each of the divided sections. The matching unit 30 may perform power transmission control (power transmission ceasing control) so that, in the periods T1 to T3, the power supplied from the source power supply 10 is not delivered to the plasma load 40 side.

Further, the matching unit 30, in the period T4, monitors the operation of the source power supply 10 to determines whether the frequency setting values should be updated, while calculating the high frequency side phase and reflection coefficient. When the reflection coefficient becomes greater than a predetermined threshold value, the matching unit 30 repeats the frequency matching calculation in each of the divided sections n and determines new frequency setting values.

Modifications

In the embodiment described above, in synchronism with the phase of the forward wave power Pf on the low frequency (bias power supply 20) side, the output of the source power supply 10 for one cycle of the operating frequency of the bias power supply 20 (for example, 400 kHz: the power supply cycle of the source power supply 10) is divided into a plurality of sections (divide-by number n), and, with respect to each section, the impedance on the high frequency side is computed using the forward wave power Pf and the reflected wave power Pr on the high frequency (source power supply 10) side. However, the phase information may be extracted from the output of the output sensor 308, and the impedance on the high frequency (source power supply 10) side may be computed on the basis of the extracted information. In fact, the output fed to the plasma load 40 (with a supply cycle of 400 kHz) is supplied from the output sensor 308. Thus, a more appropriate impedance may be acquired in accordance with the phase of the output of the output sensor 308. This is because a change in impedance on the high frequency (source power supply: the output with the frequency of 40 MHz, for example) side appears as a change in plasma load, and therefore a higher sensitivity can be obtained by detecting the phase closer to the plasma load. It is noted that the output from the output sensor reflects the phase on the low frequency (bias power supply 20) side.

CONCLUSION (i) According to the present embodiment, the high-frequency power supply system 1 includes: a bias power supply that outputs (RF output) a bias power at a low frequency (for example, 400 kHz); a source power supply that outputs (RF output) a source power at a high frequency (for example, 40 MHz); and a matching unit including an impedance matching circuit that acquires the bias power and the source power, and provides matching between an impedance on the source power supply side and an impedance on the load side. In the present embodiment, the source power supply supplies the bias power supply with a sinusoidal synchronizing signal including information about an output frequency (for example, 400 kHz) that the bias power supply should output, and the bias power supply outputs a bias power of a frequency (high frequency-side power supply cycle; namely, 400 kHz) corresponding to the output frequency included in the sinusoidal synchronizing signal. The matching unit performs: a process for dividing the forward wave power of the bias power due to the source power supply and the reflected wave power toward the source power supply for one cycle (400 kHz) into a plurality of sections: a process for determining, with respect to each of the plurality of sections, a frequency setting value for each section by performing a frequency matching calculation; and a process for transmitting the frequency setting value for each section to the source power supply. Then, the source power supply, in accordance with the frequency setting values for the plurality of sections transmitted from the matching unit, outputs a bias power in the plurality of sections. In this way, it is possible to reduce the reflected wave power Pr generated due to IMD, or the power reflection coefficient.

The frequency setting values that have been determined (a set of setting values set for each of a plurality of sections 1 to n) are used continuously until they are updated by the matching unit. The need for updating the frequency setting values is determined by whether, in the matching unit, the reflected wave power has increased due to the forward wave power supplied from the source power supply using the current frequency setting values, and the reflection coefficient has become greater than or equal to a predetermined value. If the reflection coefficient has become greater than or equal to the predetermined value, the frequency matching calculation is performed again and new frequency setting values (a set of setting values set with respect to each of the plurality of sections 1 to n) are determined. Thus, the frequency setting values that have been determined can be used continuously for a while, making it possible to avoid a situation in which power supply needs to be interrupted. In addition, when an influence due to IMD is detected (that is, when an increase in the reflection coefficient is observed), the frequency setting values are updated immediately. Accordingly, it is possible to supply power to the plasma load in an optimum state constantly.

(ii) The matching unit holds information (Table 1 and Table 2) about the S-parameters corresponding to a plurality of variable capacitors (C1, C2) included in the matching networks on the high frequency-side and the amounts of frequency shift from the fundamental frequency of the source power supply, and determines the frequency setting values for a plurality of sections by identifying, based on the S-parameters, an amount of frequency shift that minimizes the reflection coefficient on the source power supply side in each of the plurality of sections.

More specifically, the process for determining the frequency setting values for a plurality of sections includes: a process for calculating reflection coefficients on the output side in each of a plurality of sections on the basis of S-parameters (Table 1) determined by the fundamental frequency of the source power supply 10 (for example, 40 MHz) and the positions of a plurality of variable capacitors; a process for calculating reflection coefficients on the input side while changing the amount of frequency shift with reference to information about the S-parameters (Table 2); and a process for determining an optimum amount of frequency shift that minimizes the reflection coefficient on the input side. The optimum amount of frequency shift is applied to the fundamental frequency (for example, 40 MHz) to determine the frequency setting value for each of the plurality of sections.

(iii) Fundamentally, an impedance is calculated in accordance with the phase detected by the input side sensor (second sensor 302 on the low frequency side). However, an impedance may be calculated in accordance with the phase of the output side sensor (output sensor 308). In this way, it becomes possible to calculate a more appropriate impedance (high frequency side).

(iv) The functions of the present embodiment may be implemented by a software program code. In this case, a system or a device may be provided with a storage medium having the program code recorded thereon, and a computer (or a CPU or an MPU) of the system or device may read the program code stored in the storage medium. In this case, the program code per se read from the storage medium implement the functions of the embodiment, and the program code per se and the storage medium having the program code stored therein constitute the present disclosure. Examples of the storage medium for supplying the program code include flexible discs, CD-ROMs, DVD-ROMs, hard disks, optical disks, magneto-optical disks, CD-Rs, magnetic tapes, non-volatile memory cards, and ROMs.

Further, based on the instructions of a program code, an operating system (OS) or the like running on a computer may execute some or all of actual processing, and the functions of the above-described embodiment may be implemented by the processing. Furthermore, after the program code read from the storage medium is written to a memory on the computer, a CPU of the computer or the like may execute some or all of actual processing on the basis of the instructions of the program code, and the functions of the above-described embodiment may be implemented by the processing.

Further, the software program code for implementing the functions of the embodiment may be delivered via a network. The software program code can be then stored in a storage means of the system or device, such as a hard disk or a memory, or in a storage medium such as a CD-RW or a CD-R. During use, a computer (or a CPU or an MPU) of the system or device may read and execute the program code stored in the storage means or the storage medium.

The processes and techniques described herein are not inherently related to a particular device. Various general-purpose devices may be used in accordance with the teachings herein, or it may prove more convenient to construct a specialized device to perform the techniques of the present disclosure.

Various embodiments may be formed by appropriately combining a plurality of constituent elements disclosed in the present embodiment. For example, some of the constituent elements indicated in the present embodiment may be deleted. Further, constituent elements relating to different embodiments may be combined, as appropriate. Although techniques of the present disclosure have been described with reference to specific examples, the examples are intended to be illustrative and not limiting of the techniques of the present disclosure. It will be appreciated by those skilled in the art that many combinations of hardware, software, and firmware for implementing the techniques of the present disclosure are possible. For example, the described software may be implemented using a wide range of programs or script languages, such as assembler, C/C++, perl, Shell, PHP, and Java (registered trademark).

Further, with reference to the foregoing embodiment, only those control lines and information lines that are considered necessary for illustrative purposes are shown, and not necessarily all the control lines and information lines that are found in a product are shown. All the configurations may be connected with one another.

DESCRIPTION OF SYMBOLS

1 Power supply system (high-frequency power supply system)
10 Source (HF) power supply
20 Bias power supply
30 Matching unit
40 Plasma load
101 Sinusoidal synchronizing signal generator
201 Sinusoidal synchronizing signal receiver
301 First sensor
302 Second sensor
303 Frequency setting calculator
304 First matching calculator
305 Second matching calculator
306 High frequency-side matching network
307 Low frequency-side matching network
308 Output sensor

What is claimed is:

1. A high-frequency power supply system for providing a high-frequency power to a connected load, the high-frequency power supply system comprising:
   a bias power supply that outputs a bias power at a first frequency;
   a source power supply that outputs a source power at a second frequency higher than the first frequency; and
   a matching unit including an impedance matching circuit that acquires the bias power and the source power, and provides matching between an impedance on the source power supply side and an impedance on a load side,
   wherein:
   the source power supply supplies the bias power supply with a sinusoidal synchronizing signal including information about an output frequency to be outputted by the bias power supply, and
   the bias power supply outputs the bias power of a frequency corresponding to the output frequency included in the sinusoidal synchronizing signal;
   the matching unit performs
   a process for dividing a forward wave power due to the source power supply for one cycle of the bias power and a reflected wave power toward the source power supply, into a plurality of sections,
   a process for performing, with respect to each of the plurality of sections, a frequency matching calculation to determine frequency setting values for the each of the plurality of sections, and
   a process for transmitting the frequency setting values for the each of the plurality of sections to the source power supply,
   wherein the source power supply, in accordance with the frequency setting values for the plurality of sections transmitted from the matching unit, outputs the bias power in the plurality of sections.

2. The high-frequency power supply system according to claim 1, wherein the source power supply outputs the source power using the frequency setting values for the plurality of sections continuously until the frequency setting values are updated by the matching unit.

3. The high-frequency power supply system according to claim 1, wherein the matching unit calculates a reflection coefficient on the source power supply side, and performs the frequency matching calculation when the reflection coefficient is greater than or equal to a predetermined value.

4. The high-frequency power supply system according to claim 1, wherein:
   the matching unit holds information about an S-parameter corresponding to a plurality of variable capacitors included in a matching network on the high frequency side and to an amount of frequency shift from a fundamental frequency of the source power supply, and determines the frequency setting values for the plurality of sections by identifying, based on the S-parameter and in the each of the plurality of sections, an amount of frequency shift that minimizes a reflection coefficient on the source power supply side.

5. The high-frequency power supply system according to claim 4, wherein:
   the matching unit performs, in the process for determining the frequency setting values for the plurality of sections,
   a process for calculating a reflection coefficient on an output side in each of the plurality of sections, based on the S-parameter determined by the second frequency that is the fundamental frequency of the source power supply and positions of the plurality of variable capacitors,
   a process for calculating a reflection coefficient on an input side with reference to the information about the S-parameter, while changing the amount of frequency shift, and
   a process for determining an optimum amount of frequency shift that minimizes the reflection coefficient on the input side,
   wherein the matching unit determines the frequency setting values for the each of the plurality of sections, using the optimum amount of frequency shift.

* * * * *